United States Patent
Lee

(10) Patent No.: US 8,253,185 B2
(45) Date of Patent: Aug. 28, 2012

(54) MEMORY DEVICE AND METHOD FOR FABRICATING THE SAME

(75) Inventor: Nam-Jae Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 516 days.

(21) Appl. No.: 12/413,427

(22) Filed: Mar. 27, 2009

(65) Prior Publication Data

US 2010/0052031 A1 Mar. 4, 2010

(30) Foreign Application Priority Data

Aug. 27, 2008 (KR) .......................... 10-2008-0083988

(51) Int. Cl.
*H01L 29/788* (2006.01)

(52) U.S. Cl. ......... 257/316; 257/E27.103; 257/E29.304; 365/185.17; 365/185.26

(58) Field of Classification Search .................. 257/316, 257/E27.103, E29.3, E29.304; 365/185.17, 365/185.26
See application file for complete search history.

(56) References Cited

U.S. PATENT DOCUMENTS

| | | | |
|---|---|---|---|
| 7,773,429 B2 * | 8/2010 | Jeon et al. ................ | 365/185.17 |
| 2006/0234447 A1 * | 10/2006 | Choi et al. .................... | 438/257 |
| 2008/0205162 A1 | 8/2008 | Jeon et al. | |
| 2010/0295185 A1 * | 11/2010 | Park ............................ | 257/773 |

FOREIGN PATENT DOCUMENTS

| | | |
|---|---|---|
| JP | 2006-286697 | 10/2006 |
| KR | 100691384 B1 | 2/2007 |
| KR | 100761409 B1 | 9/2007 |

\* cited by examiner

*Primary Examiner* — Mary Wilczewski
*Assistant Examiner* — Toniae Thomas
(74) *Attorney, Agent, or Firm* — Kilpatrick Townsend & Stockton LLP

(57) ABSTRACT

A memory device includes gate lines and select lines formed over a substrate, and at least two dummy lines formed in a gap region between adjacent select lines. The memory device is able to reduce a width of the select line by enhancing uniformity of the line pattern density. Therefore, a degree of integration of the memory device is enhanced and the cost of production is reduced. Furthermore, by forming a source line in a gap region between adjacent dummy lines, it is possible to secure a process margin of photolithography for forming a contact hole and to reduce contact resistance.

5 Claims, 6 Drawing Sheets

MEMORY DEVICE AND METHOD FOR FABRICATING THE SAME

CROSS-REFERENCE TO RELATED APPLICATIONS

The present invention claims priority of Korean patent application number 10-2008-0083988, filed on Aug. 27, 2008 which is incorporated by reference in its entirety.

BACKGROUND OF THE INVENTION

The present invention relates to a semiconductor device and a method for fabricating the same, and more particularly, to a memory device and a method for fabricating the same.

A non-volatile memory device is a memory device that retains stored information even when not powered. Non-volatile memory devices are classified into a floating gate electrode type or a charge trap type according to a data storage scheme.

The floating gate electrode type non-volatile memory device includes a tunnel insulation layer, a floating gate electrode, a charge blocking layer and a control gate electrode over a substrate. Charges are stored in or erased from the floating gate electrode so as to store data.

The charge trap type non-volatile memory device includes a tunnel insulation layer, a charge trap layer, a charge blocking layer and a gate electrode over a substrate. Charges are stored in or erased from a deep level trap site in the charge trap layer so as to store data.

Hereinafter, a structure of a conventional non-volatile memory device and problems thereof will be described in detail with reference to related figures.

FIG. 1 is a view illustrating a layout of a conventional non-volatile memory device.

Referring to FIG. 1, an active region 101 is defined by a line type device isolation layer formed in a field region 102. Over a substrate, bit lines BL are formed in a first direction A-A', and a plurality of source select lines SSL and drain select lines DSL are formed in a second direction B-B' intersecting the first direction A-A'. Furthermore, a plurality of word lines WL are formed between the source select lines SSL and the drain select lines DSL.

The source select line SSL represents the connection of gate electrodes of source select transistors, and a common source line CSL is formed in a junction region between the source select lines SSL. The drain select line DSL represents the connection of gate electrodes of drain select transistors, and a drain contact plug DCT is formed in a junction region between the drain select lines DSL.

FIGS. 2A to 2D illustrate cross-sectional views of a method for fabricating the conventional non-volatile memory device taken along the line A-A' of FIG. 1.

Referring to FIG. 2A, a gate pattern of a stacked structure is formed over a substrate 200. The gate pattern includes a tunnel insulation layer 210, a floating gate electrode 220, a charge blocking layer 230 and a control gate electrode 240. The gate pattern is used as a gate line connecting gate electrodes of memory cells or as a select line SL connecting gate electrodes of select transistors.

The tunnel insulation layer 210 is provided as an energy barrier layer for the charge tunneling and, thus, is formed with an oxide layer. The floating gate electrode 220 stores data by storing or erasing charges therein or therefrom. The charge blocking layer 230 is provided to prevent charges from passing through the floating gate electrode 220 and moving upward. The charge blocking layer 230 is formed with an ONO layer constructed by sequentially stacking an oxide layer, a nitride layer and an oxide layer. For a normal transistor operation, in a select transistor, the floating gate electrode 220 and the control gate electrode 240 are connected to each other by cutting off a portion of the charge blocking layer 230. The control gate electrode 240 is formed of polysilicon.

In a subsequent process, a common source line CSL is formed in a gap region between select lines SL and extends in the second direction B-B'. Therefore, in order to secure a region where the common source line CSL is to be formed (i.e., a common source line potential region CSL') a width W1 of the gap region between the select lines SL is greater than a width W2 of a gap region between gate lines.

However, when the pattern has a density difference, an etch rate is increased in a relatively large etch area due to a micro loading effect. Therefore, in this memory device, a width W3 of the select line SL is formed to be greater than a width of the gate line so as to prevent the micro loading effect from occurring by the density difference of the pattern. However, since the increase of the width W3 of the select line SL results in an increase of a cell area, a degree of integration of the memory device is decreased.

Referring to FIG. 2B, after forming an oxide layer for a spacer on an entire surface of a resultant structure including the gate pattern, a spacer 250 is formed on sidewalls of the gate pattern by spacer-etching the oxide layer. Since the width W2 of the gap region between the gate lines is relatively narrow, the gap region is filled with the spacer 250. Since the gap region between the select lines SL is relatively wide, a portion of the gap region is filled with the spacer 250 and a center of the gap region is exposed.

An etch stop layer 260 is formed on an entire surface of a resultant structure including the spacer 250. The etch stop layer 260 is formed with a nitride layer. The etch stop layer 260 is formed in the exposed center region between the select lines SL. That is, the etch stop layer 260 is formed on the spacer 250 that is formed on the sidewalls of the select lines SL. The etch stop layer 260 acts as an etch barrier in a subsequent process of etching an inter-insulation layer, which reduces an area of a contact hole.

Referring to FIG. 2C, an inter-insulation layer 270 is formed on an entire surface of a resultant structure including the etch stop layer 260. A line type photoresist pattern 280 is formed on the inter-insulation layer 270. The photoresist pattern 280 extends in the second direction while exposing the common source line potential region CSL'.

Referring to FIG. 2D, a contact hole is formed to expose the substrate 200 under the gap region between the select lines SL by etching the inter-insulation layer 270 using the photoresist pattern 280 as an etch barrier. During the process of etching the inter-insulation layer 270, the self-aligned etching is performed by the etch stop layer 260 formed on the sidewalls of the select lines SL so that a width W4 of the contact hole is reduced.

Subsequently, a common source line CLS 290 is formed by filling the contact hole with a conductive layer. If a width of the common source line 290 is reduced by the decrease of the width W4 of the contact hole due to the etch stop layer 260, the contact resistance of the common source line CLS is increased. According to the above processes, since it is difficult to secure a process margin of photolithography, when the photoresist pattern 280 is formed to deviate from the common source line potential region CSL', the width of the common source line 290 is further reduced.

Although the above description is provided with reference to the floating gate electrode type non-volatile memory device, the above problems may occur in any non-volatile memory device that employs a plurality of gate lines and select lines that together construct strings.

SUMMARY OF THE INVENTION

Embodiments of the present invention are directed to provide a non-volatile memory device including at least two dummy lines in a gap region between select lines, and a method for fabricating the memory device.

In accordance with an aspect of the present invention, a memory device includes: a plurality of gate lines and a plurality of select lines formed over a substrate, wherein the gate lines and select lines together construct strings; and at least two dummy lines formed in a gap region between adjacent select lines.

In accordance with another aspect of the present invention, a method for fabricating a memory device includes: forming a tunnel insulation layer, a conductive layer for a floating gate electrode, a charge blocking layer and a conductive layer for a control gate electrode over a substrate; and selectively etching the conductive layer for the control gate electrode, the charge blocking layer and the conductive layer for the floating gate electrode, thereby forming a plurality of gate lines, a plurality of select lines and at least two dummy lines disposed in a gap region between adjacent select lines, wherein the gate lines, the select lines and the dummy lines together construct strings.

DESCRIPTION OF SPECIFIC EMBODIMENTS

Figure 1:
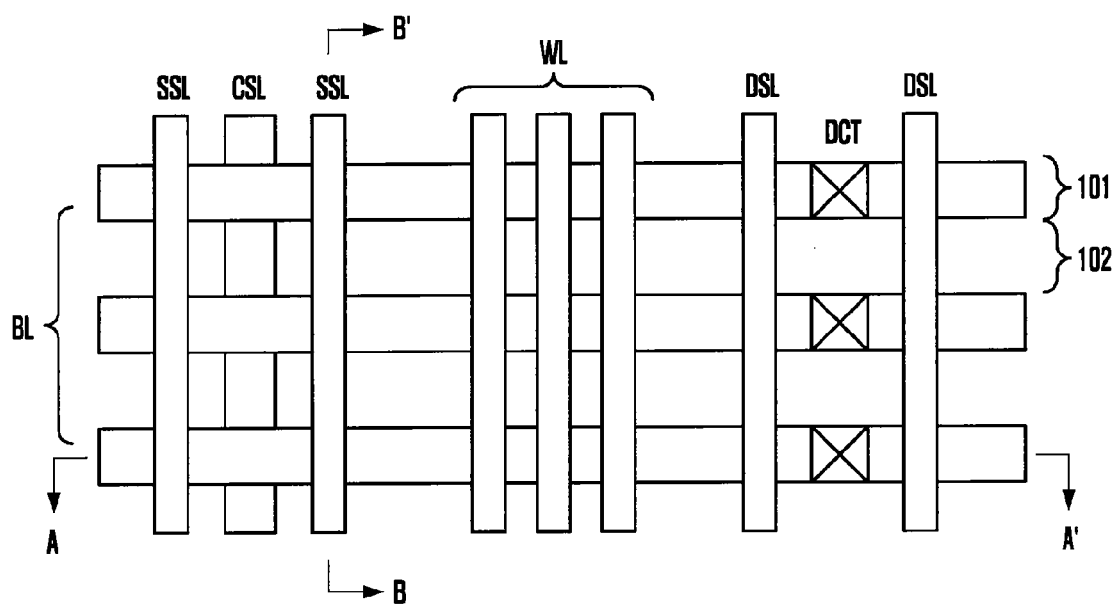
FIG. 1 is a view illustrating a layout of a conventional non-volatile memory device.
Figure 2A:
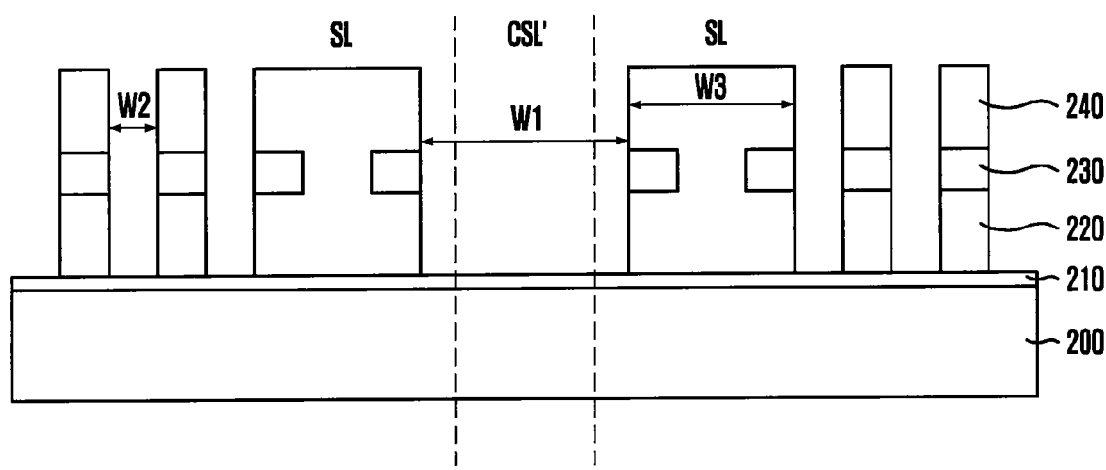
FIGS. 2A to 2D illustrate cross-sectional views of a method for fabricating the conventional non-volatile memory device.
Figure 2B:
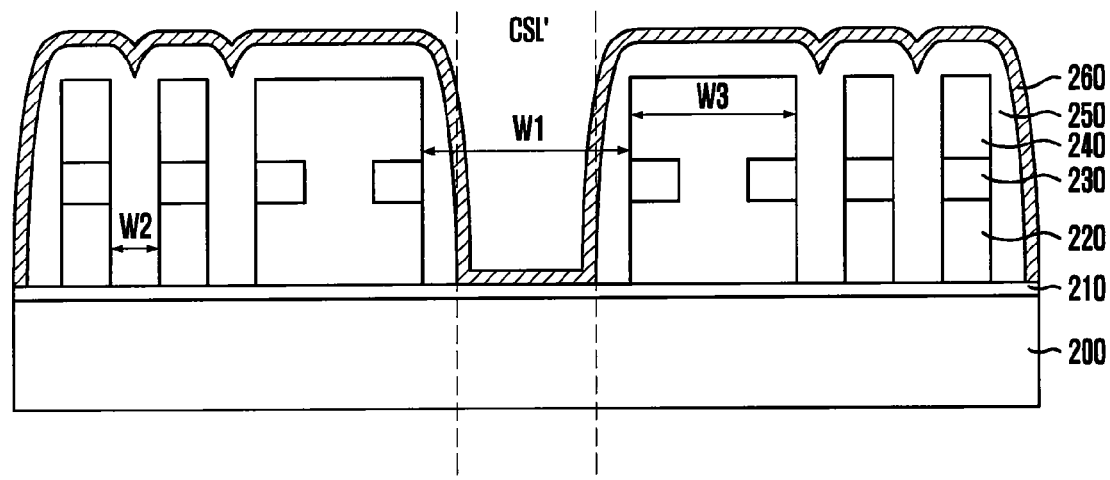
Figure 2C:
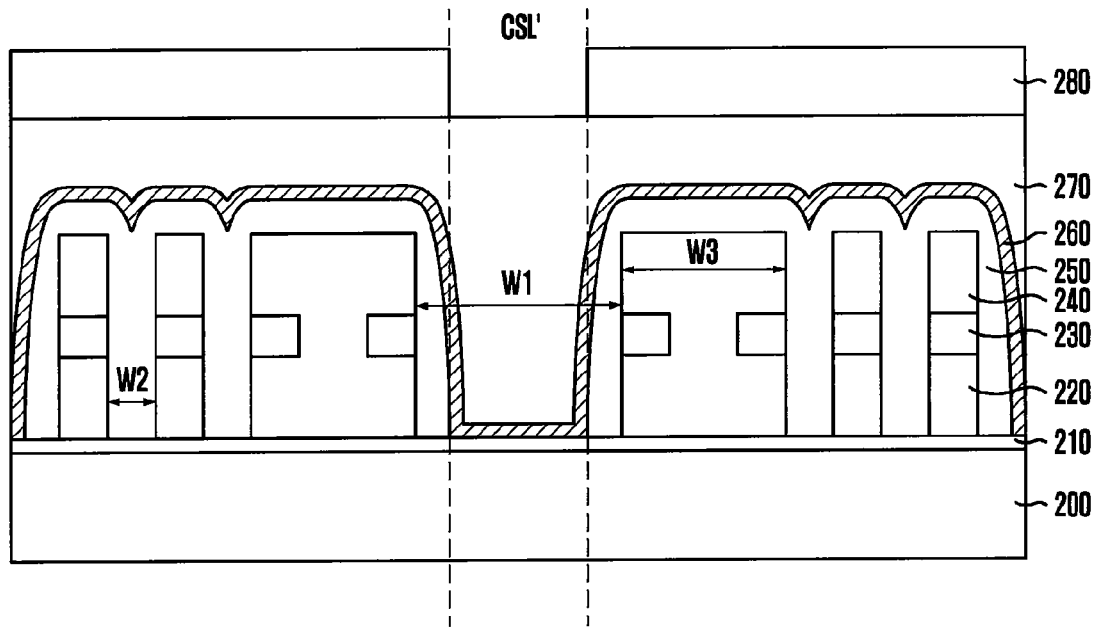
Figure 2D:
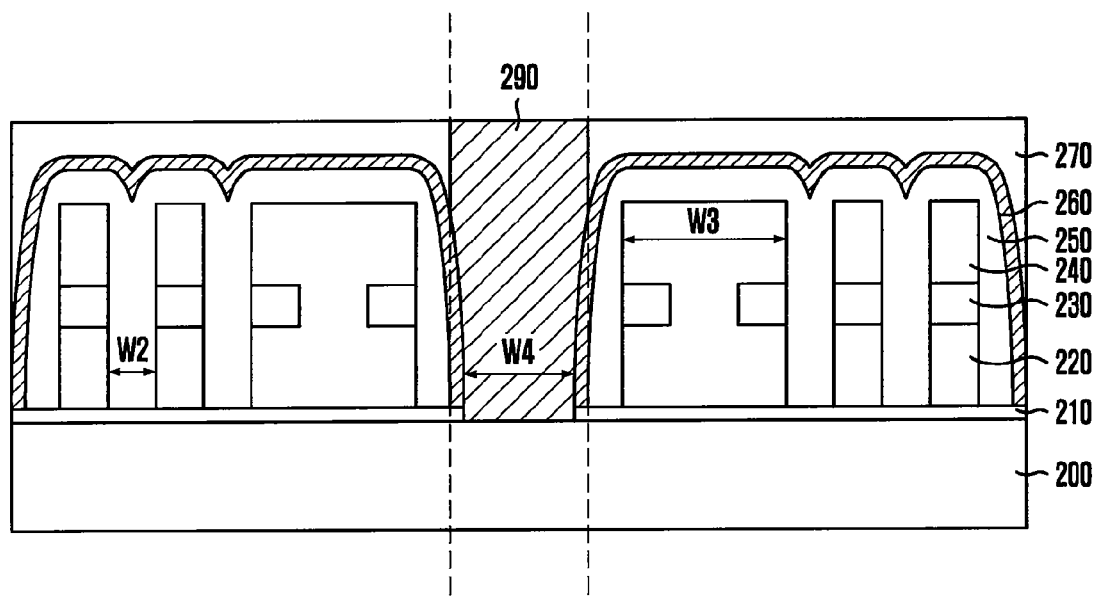

Other objects and advantages of the present invention can be understood by the following description, and become apparent with reference to the embodiments of the present invention. In the figures, the dimensions of layers and regions may be exaggerated for clarity of illustration. Like reference numerals refer to like elements throughout. It will also be understood that when a layer, a film, a region or a plate is referred to as being 'on' another one, it can be directly on the other one, or one or more intervening layers, films, regions or plates may also be present.

Figure 3:
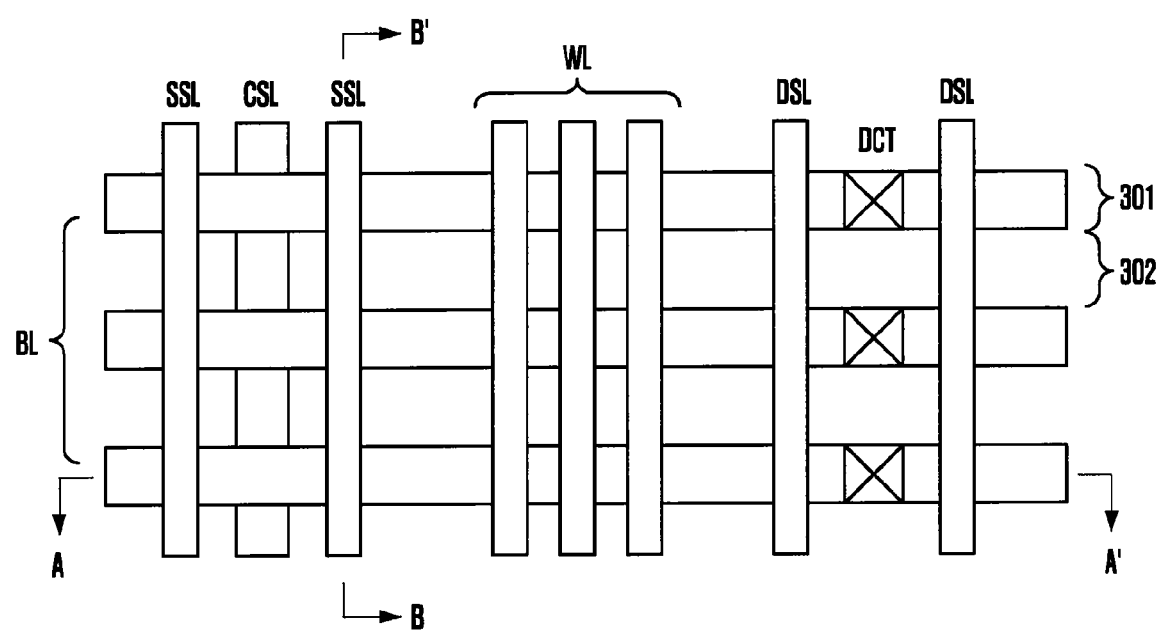
FIG. 3 is a view illustrating a layout of a non-volatile memory device in accordance with an embodiment of the present invention.

FIG. 3 is a view illustrating a layout of a non-volatile memory device in accordance with an embodiment of the present invention.

Referring to FIG. 3, an active region 301 is defined by a line type device isolation layer formed in a field region 302. Over a substrate, bit lines BL are formed in a first direction A-A', and a plurality of source select lines SSL and drain select lines DSL are formed in a second direction B-B' intersecting the first direction A-A'. Furthermore, a plurality of word lines WL are formed between the source select lines SSL and the drain select lines DSL.

The source select line SSL represents the connection of gate electrodes of source select transistors, and a common source line CSL is formed in a junction region between the source select lines SSL. The drain select line DSL represents the connection of gate electrodes of drain select transistors, and a drain contact plug DCT is formed in a junction region between the drain select lines DSL.

FIGS. 4A to 4D are cross-sectional views describing a method for fabricating the non-volatile memory device in accordance with the embodiment of the present invention and taken along the line A-A' of FIG. 3.

Figure 4A:
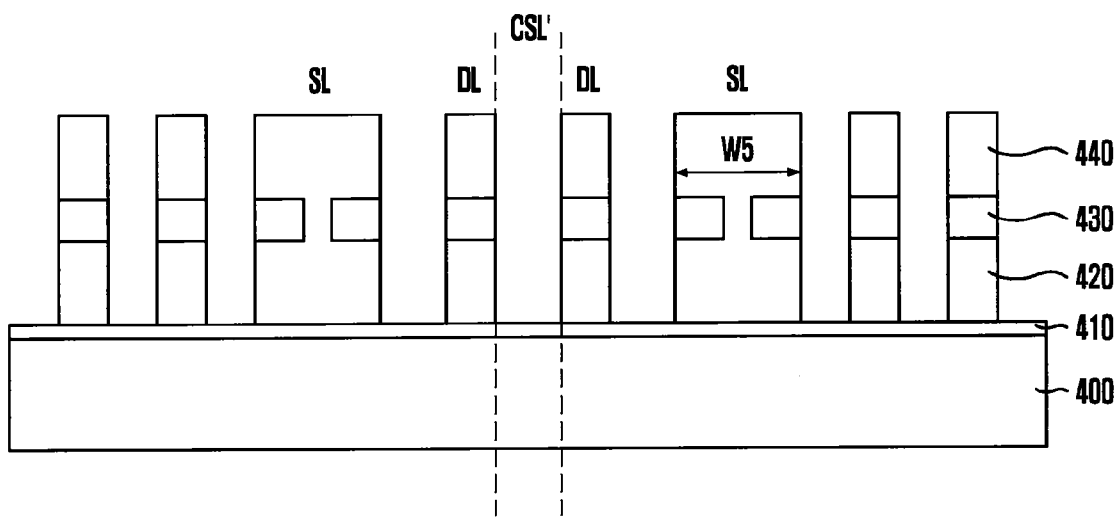
FIGS. 4A to 4D are cross-sectional views describing a method for fabricating the non-volatile memory device in accordance with the embodiment of the present invention.

Referring to FIG. 4A, after forming a tunnel insulation layer, a conductive layer for a floating gate electrode, a charge blocking layer and a conductive layer for a control gate electrode over a substrate 400, the above layers are selectively etched to form a gate pattern including a tunnel insulation layer 410, a floating gate electrode 420, a charge blocking layer 430 and a control gate electrode 440.

The tunnel insulation layer 410 is provided as an energy barrier layer for the charge tunneling and, thus, may be formed with an oxide layer. The floating gate electrode 420 stores data by storing or erasing charges therein or therefrom, and may be formed with a polysilicon layer.

The charge blocking layer 430 is provided to prevent charges from passing through the floating gate electrode 420 and moving upward. The charge blocking layer 430 may be formed with an ONO layer constructed by sequentially stacking an oxide layer, a nitride layer and an oxide layer. For a normal transistor operation, in the select transistor, the floating gate electrode 420 and the control gate electrode 440 are connected to each other by cutting off a portion of the charge blocking layer 430. The control gate electrode 440 may include a polysilicon layer, a tungsten layer, a metal silicide layer or a combination thereof.

As described above, the gate pattern may be used as a gate line connecting gate electrodes of memory cells or as a select line SL connecting gate electrodes of select transistors. The gate line and the select line together construct a string of a NAND flash memory device.

The gate line disposed in a gap region between adjacent select lines is used as a dummy line DL. It is preferable to form at least two dummy lines DL. A gap region between adjacent dummy lines DL becomes a region where a common source line is to be formed in a subsequent process (i.e., a common source line potential region CSL').

Since the dummy lines DL are formed in the gap region between adjacent select lines SL, the density of the pattern is uniformly distributed. Therefore, it is possible to prevent a micro loading effect from occurring and to further reduce a width W5 of the select line SL relative to the prior art.

Figure 4B:
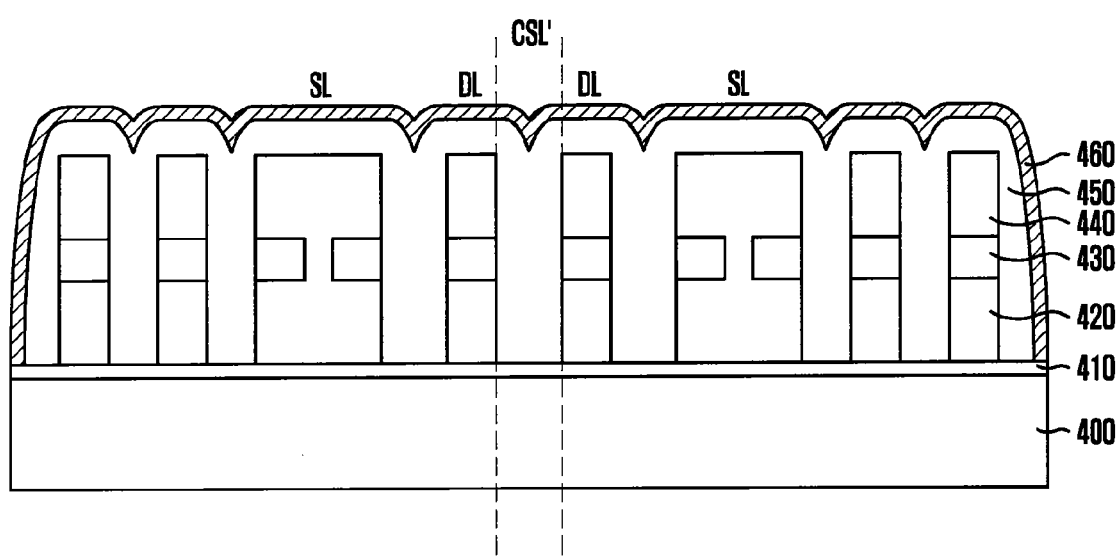

Referring to FIG. 4B, after forming an oxide layer for a spacer on an entire surface of a resultant structure including the gate pattern, a spacer 450 is formed on sidewalls of the gate pattern by spacer-etching the oxide layer.

Since a width of a gap region between the dummy line DL and the select line SL adjacent to the dummy line DL and a width of a gap region between adjacent dummy lines DL are relatively narrow, the gap regions are completely filled with the spacer 450. Therefore, the common source line potential region CSL' is also completely filled with the spacer 450.

An etch stop layer 460 is formed on an entire surface of a resultant structure including the spacer 450. It is preferable that the etch stop layer 460 includes a nitride layer. Since the gap region between the dummy line DL and the select line SL adjacent to the dummy line DL and the gap region between adjacent dummy lines DL are completely filled with the spacer 450, the etch stop layer 460 is not formed in the gap region between the adjacent dummy lines DL. In other words, the etch stop layer 460 is not formed in the common source line potential region CSL'. As a result, it is possible to prevent the reduction of a width of a contact hole due to the etch stop layer 460 when forming the contact hole.

Figure 4C:
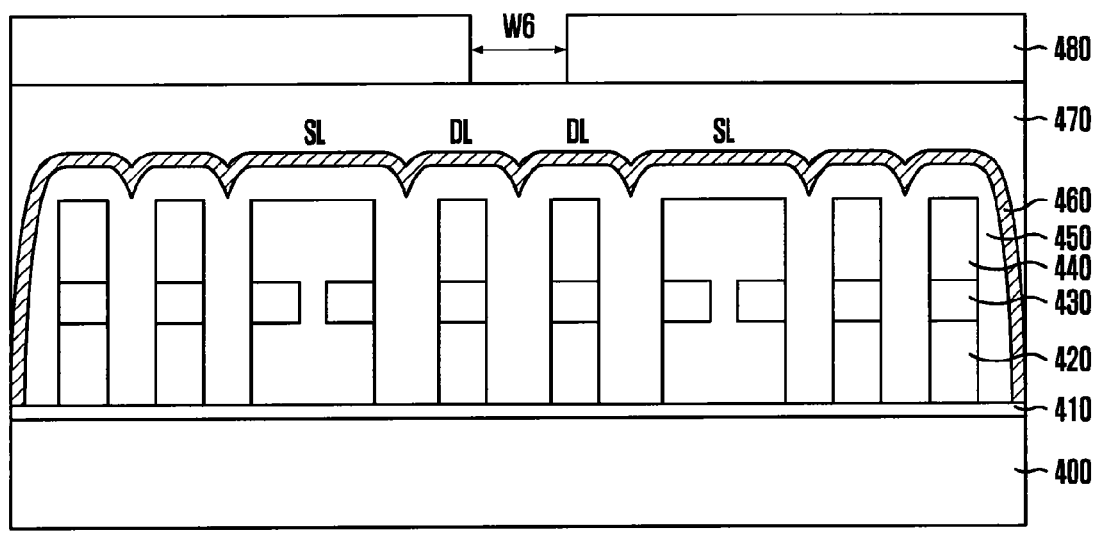

Referring to FIG. 4C, an inter-insulation layer 470 is formed on an entire surface of a resultant structure including the etch stop layer 460. The inter-insulation layer 470 may include a high density plasma (HDP) oxide layer.

A line type photoresist pattern 480 is formed on the inter-insulation layer 470. The photoresist pattern 480 extends in the second direction B-B'. The photoresist pattern 480 has an opened portion to expose a portion of the inter-insulation layer 470 that corresponds to the common source line potential region CSL'.

In a subsequent process of forming the contact hole, the self-aligned etching can be performed by the dummy lines DL. Therefore, the photoresist pattern 480 may be formed to have a space width W6 that is greater than the width of the common source line potential region CSL'. In other words, it is possible to secure a process margin of photolithography.

Figure 4D:
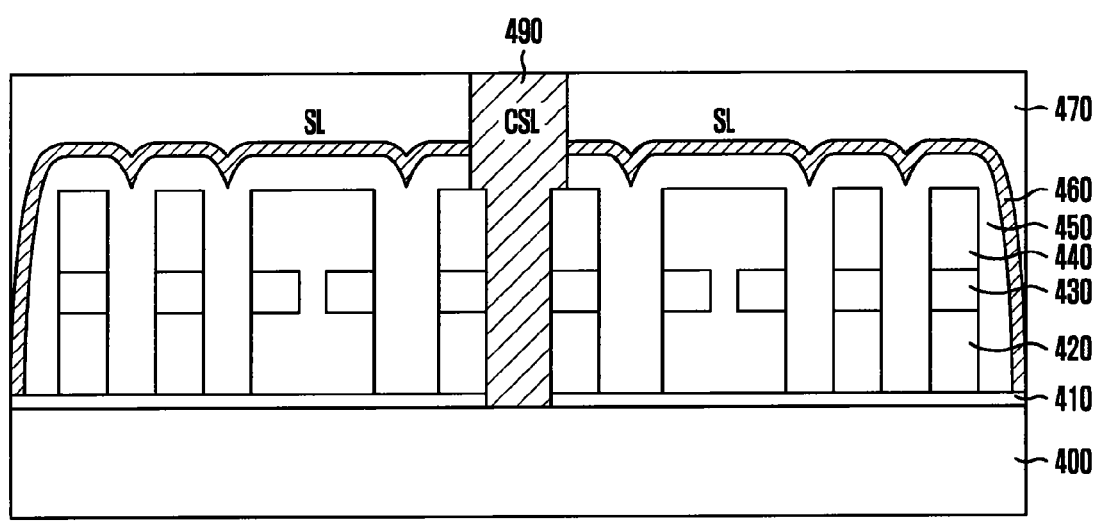

Referring to FIG. 4D, the contact hole is formed to expose the common source line potential region CSL' by etching the inter-insulation layer 470, the etch stop layer 460 and the spacer 450 using the photoresist pattern 480 as an etch barrier. The contact hole exposes the substrate 400 under the gap region between the adjacent dummy lines DL. The common source line CSL 490 is then formed by filling the contact hole with a conductive layer.

It is preferable to form the common source line 490 to contact the dummy lines DL. Since the common source line 490 is connected with the dummy lines in parallel, it is possible to reduce the resistance of the common source line 490. In a process of injecting impurities to form NMOS transistors in a peripheral circuit region, it is preferable to form an impurity region in the substrate 400 on both sides of the dummy line DL by opening a dummy line region as well. As a result, when a voltage of 0V is supplied to the source line, it is possible to prevent the dummy line from operating as a transistor.

Although the above description relates to the floating gate type non-volatile memory device and the method for fabricating the same, the present invention is applicable to all kinds of memory devices. For example, the present invention is applicable to a charge trap type non-volatile memory device that employs select lines and gate lines that together construct strings.

In accordance with the present invention, the uniformity of the pattern density is enhanced by forming at least two dummy lines in the gap region between adjacent select lines, so that the width of the select line can be reduced. As a result, a degree of integration of the memory device is enhanced and the cost of production is reduced.

Furthermore, by forming the source line in the gap region between adjacent dummy lines, it is possible to secure a process margin of photolithography for forming the contact hole and to reduce contact resistance.

While the present invention has been described with respect to specific embodiments, it will be apparent to those skilled in the art that various changes and modifications may be made without departing from the spirit and scope of the invention as defined in the following claims.

What is claimed is:

1. A memory device comprising:
    a plurality of gate lines and a plurality of select lines formed over a substrate, wherein the gate lines and the select lines together construct strings;
    at least two dummy lines formed in a gap region between adjacent select lines; and
    a source line formed between adjacent dummy lines.

2. The memory device of claim 1, wherein the dummy lines are formed to contact the source line to reduce the resistance of the source line.

3. The memory device of claim 2, wherein each of the gate line, the select line and the dummy line comprises a tunnel insulation layer, a floating gate electrode, a charge blocking layer and a control gate electrode.

4. The memory device of claim 3, wherein the control gate electrode comprises one of a polysilicon layer, a tungsten layer, a metal silicide layer and a combination thereof.

5. The memory device of claim 2, wherein the dummy line does not operate as a transistor due to an impurity region formed in the substrate on both sides of the dummy line.

* * * * *